US012154753B2

(12) United States Patent
Scheuer et al.

(10) Patent No.: US 12,154,753 B2
(45) Date of Patent: Nov. 26, 2024

(54) DEVICE TO CONTROL UNIFORMITY OF EXTRACTED ION BEAM

(71) Applicant: Applied Materials, Inc., Santa Clara, CA (US)

(72) Inventors: Jay T. Scheuer, Rowley, MA (US); Graham Wright, Newburyport, MA (US); Peter F. Kurunczi, Cambridge, MA (US); Alexandre Likhanskii, Middleton, MA (US)

(73) Assignee: Applied Materials, Inc., Santa Clara, CA (US)

( * ) Notice: Subject to any disclaimer, the term of this patent is extended or adjusted under 35 U.S.C. 154(b) by 476 days.

(21) Appl. No.: 17/473,101

(22) Filed: Sep. 13, 2021

(65) Prior Publication Data

US 2023/0082224 A1   Mar. 16, 2023

(51) Int. Cl.
*H01J 37/08* (2006.01)
*H01J 37/317* (2006.01)

(52) U.S. Cl.
CPC .......... *H01J 37/08* (2013.01); *H01J 37/3171* (2013.01); *H01J 2237/06308* (2013.01); *H01J 2237/0815* (2013.01)

(58) Field of Classification Search
CPC .... H01J 37/08; H01J 37/3171; H01J 37/3244; H01J 37/32504; H01J 2237/061; H01J 2237/06308; H01J 2237/083; H01J 2237/0815
See application file for complete search history.

(56) References Cited

U.S. PATENT DOCUMENTS

| 5,177,366 | A | * | 1/1993 | King | H01J 37/3171 250/398 |
| 6,335,534 | B1 | * | 1/2002 | Suguro | H01J 37/3171 250/424 |
| 6,348,764 | B1 | | 2/2002 | Chen et al. | |
| 8,659,229 | B2 | | 2/2014 | Kurunczi et al. | |

(Continued)

FOREIGN PATENT DOCUMENTS

| CN | 103325648 A | 9/2013 |
| KR | 10-1144222 B1 | 5/2012 |

(Continued)

OTHER PUBLICATIONS

International Search Report and Written Opinion mailed Dec. 8, 2022 in corresponding PCT application No. PCT/US2022/040773.

*Primary Examiner* — Tung X Le

(74) *Attorney, Agent, or Firm* — Nields, Lemack & Frame, LLC

(57) ABSTRACT

An ion source capable of extracting a ribbon ion beam with improved uniformity is disclosed. One of the walls of the ion source has a protrusion on its interior surface facing the chamber. The protrusion creates a loss area that serves as a sink for free electrons and ions. This causes a reduction in plasma density near the protrusion, and may improve the uniformity of the ribbon ion beam that is extracted from the ion source by modifying the beam current near the protrusion. The shape of the protrusion may be modified to achieve the desired uniformity. The protrusion may also be utilized with a cylindrical ion source. In certain embodiments, the protrusion is created by a plurality of mechanically adjustable protrusion elements.

14 Claims, 10 Drawing Sheets

(56) References Cited

U.S. PATENT DOCUMENTS

| | | | |
|---|---|---|---|
| 9,865,422 B2 * | 1/2018 | Horsky | H01J 27/205 |
| 2009/0166554 A1 * | 7/2009 | Radovanov | H01J 37/08 |
| | | | 250/424 |
| 2010/0051825 A1 | 3/2010 | Yamashita et al. | |
| 2011/0139613 A1 * | 6/2011 | Ikejiri | H01J 27/022 |
| | | | 204/298.12 |
| 2012/0255490 A1 * | 10/2012 | Tanjo | H01J 37/3171 |
| | | | 118/638 |
| 2013/0249400 A1 * | 9/2013 | Sato | H01J 27/024 |
| | | | 315/111.81 |
| 2013/0260544 A1 * | 10/2013 | Koo | H01J 37/3171 |
| | | | 438/514 |
| 2013/0313443 A1 * | 11/2013 | Koo | H01J 37/32422 |
| | | | 250/427 |
| 2014/0062286 A1 * | 3/2014 | Sato | H01J 5/10 |
| | | | 313/231.41 |
| 2016/0111250 A1 | 4/2016 | Sato | |
| 2017/0110282 A1 | 4/2017 | White | |
| 2018/0138020 A1 | 5/2018 | Koo et al. | |
| 2020/0194219 A1 | 6/2020 | Heres et al. | |
| 2021/0134569 A1 | 5/2021 | Radovanov et al. | |

FOREIGN PATENT DOCUMENTS

| | | |
|---|---|---|
| TW | 201616542 A | 5/2016 |
| TW | I648761 B | 1/2019 |
| TW | 202036638 A | 10/2020 |
| WO | 2020/185348 A1 | 9/2020 |

* cited by examiner

DEVICE TO CONTROL UNIFORMITY OF EXTRACTED ION BEAM

This disclosure describes systems for controlling the uniformity of a ribbon ion beam extracted from an ion source, such as an indirectly heated cathode (IHC) ion source.

BACKGROUND

Semiconductor devices are fabricated using a plurality of processes, some of which implant ions into the workpiece. Various ion sources may be used to create the ions. One such mechanism is an indirectly heated cathode (IHC) ion source. An IHC ion source comprises a filament disposed behind a cathode. The cathode may be maintained at a more positive voltage than the filament. As current is passed through the filament, the filament emits thermionic electrons, which are accelerated toward the more positively charged cathode. These thermionic electrons serve to heat the cathode, in turn causing the cathode to emit electrons into the chamber of the ion source. The cathode is disposed at one end of a chamber. A repeller is typically disposed on the end of the chamber opposite the cathode.

In certain embodiments, the IHC ion source is configured to extract a ribbon ion beam, where a width of the ribbon ion beam is much larger than the height of the ribbon ion beam. Unfortunately, in many systems, the beam current of the extracted ribbon ion beam is not uniform along its width. This non-uniformity may cause uneven concentrations of ions implanted into the workpiece. In other embodiments, additional components in the beam line, such as quadrupole lenses, may be utilized to try to compensate for this non-uniformity. These remedies may add additional complexity and cost to the beam line system.

Therefore, it would be beneficial if there was a system that could control the uniformity of a ribbon ion beam being extracted from an ion source.

SUMMARY

An ion source capable of extracting a ribbon ion beam with improved uniformity is disclosed. One of the walls of the ion source has a protrusion on its interior surface facing the chamber. The protrusion creates a loss area that serves as a sink for free electrons and ions. This causes a reduction in plasma density near the protrusion, and may improve the uniformity of the ribbon ion beam that is extracted from the ion source by modifying the beam current near the protrusion. The shape of the protrusion may be modified to achieve the desired uniformity. The protrusion may also be utilized with a cylindrical ion source. In certain embodiments, the protrusion is created by a plurality of mechanically adjustable protrusion elements.

According to one embodiment, an ion source is disclosed. The ion source comprises a chamber comprising a first end, a second end and a plurality of walls connecting the first end and the second end, wherein one of the plurality of walls is an extraction plate having an extraction aperture having a width greater than its height; and a plasma generator to generate a plasma within the chamber; wherein one of the plurality of walls, different from the extraction plate, is a protruding wall, having a protrusion extending toward an interior of the chamber. In some embodiments, the protrusion extends at least 3 mm into the chamber at at least one location. In certain embodiments, wherein the protrusion comprises a constant radius of curvature from the first end to the second end. In some embodiments, the protrusion comprises a triangular shape. In some embodiments, the protrusion comprises a trapezoidal shape. In some embodiments, the protruding wall is opposite the extraction plate. In certain embodiments, the protruding wall is adjacent to the extraction plate. In some embodiments, the plasma generator comprises an indirectly heated cathode disposed at the first end.

According to another embodiment, an ion source is disclosed. The ion source comprises a chamber comprising a first end, a second end, and a cylindrical housing connecting the first end and the second end, wherein an extraction aperture having a width greater than its height is disposed on the cylindrical housing; and a plasma generator to generate a plasma within the chamber; wherein a protrusion extends from the cylindrical housing toward an interior of the chamber. In some embodiments, the protrusion is disposed on the cylindrical housing opposite the extraction aperture so as to be offset from the extraction aperture by 180°. In some embodiments, the protrusion is offset from the extraction aperture by 90°. In certain embodiments, the plasma generator comprises an indirectly heated cathode disposed at the first end. In some embodiments, a maximum thickness of the protrusion occurs at a center of the extraction aperture in a width direction.

According to another embodiment, an ion source is disclosed. The ion source comprises a chamber comprising a first end, a second end and a plurality of walls connecting the first end and the second end, wherein one of the plurality of walls is an extraction plate having an extraction aperture having a width greater than its height; a plasma generator to generate a plasma within the chamber; and a plurality of mechanically adjustable protrusion elements, electrically connected to the plurality of walls, extending into an interior of the chamber. In some embodiments, the ion source comprises an actuator to control a position of the plurality of mechanically adjustable protrusion elements within the chamber. In certain embodiments, each of the plurality of mechanically adjustable protrusion elements is independently controlled. In some embodiments, the plurality of mechanically adjustable protrusion elements extends through a wall that is opposite the extraction plate. In certain embodiments, the plurality of mechanically adjustable protrusion elements extends through a wall that is adjacent to the extraction plate. In some embodiments, the plasma generator comprises an indirectly heated cathode disposed at the first end.

BRIEF DESCRIPTION OF THE DRAWINGS

For a better understanding of the present disclosure, reference is made to the accompanying drawings, in which like elements are referenced with like numerals, and in which.

DETAILED DESCRIPTION

Figure 1A:
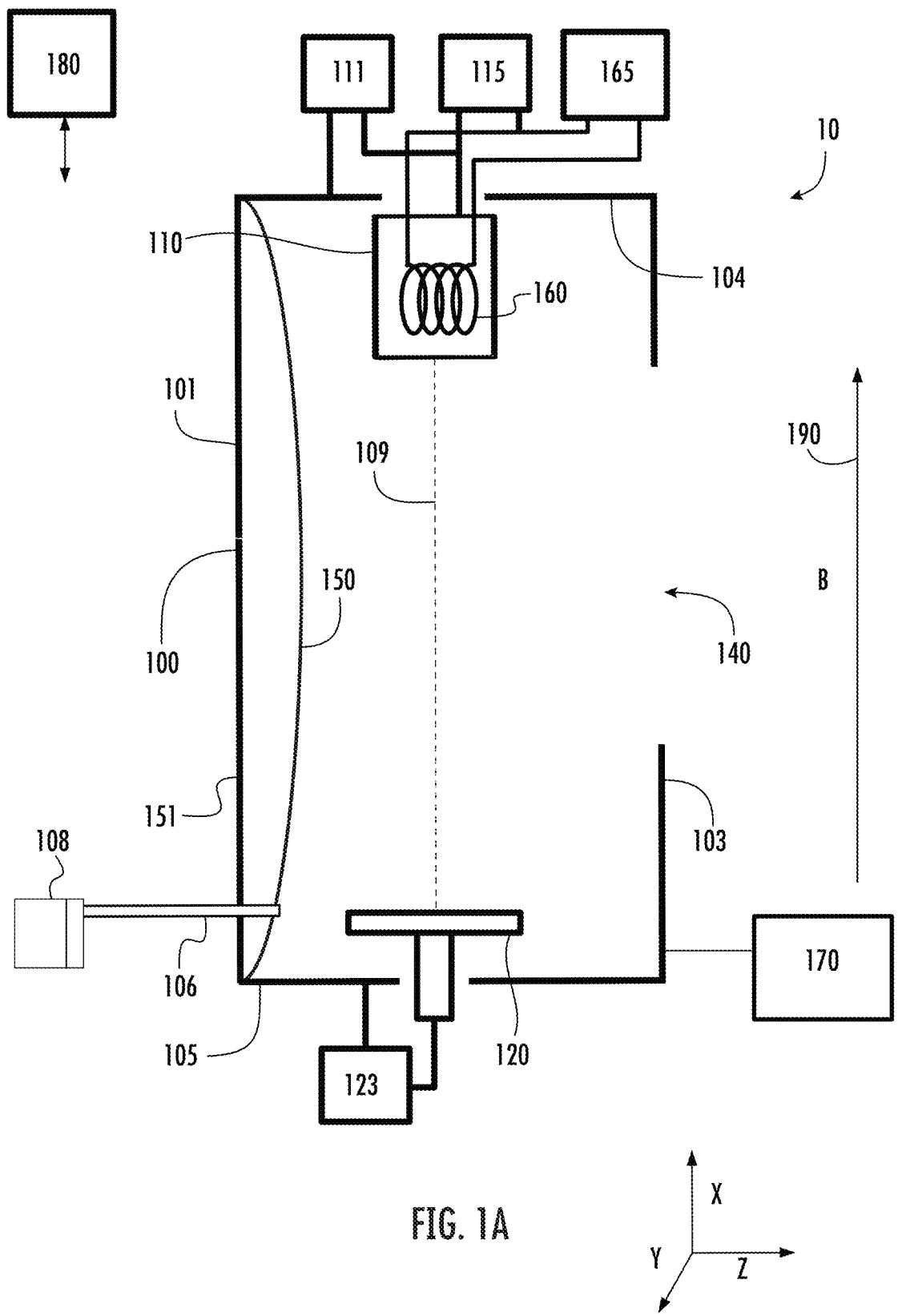
FIGS. 1A-1B are block diagrams showing an IHC ion source according to two embodiments.
Figure 1B:
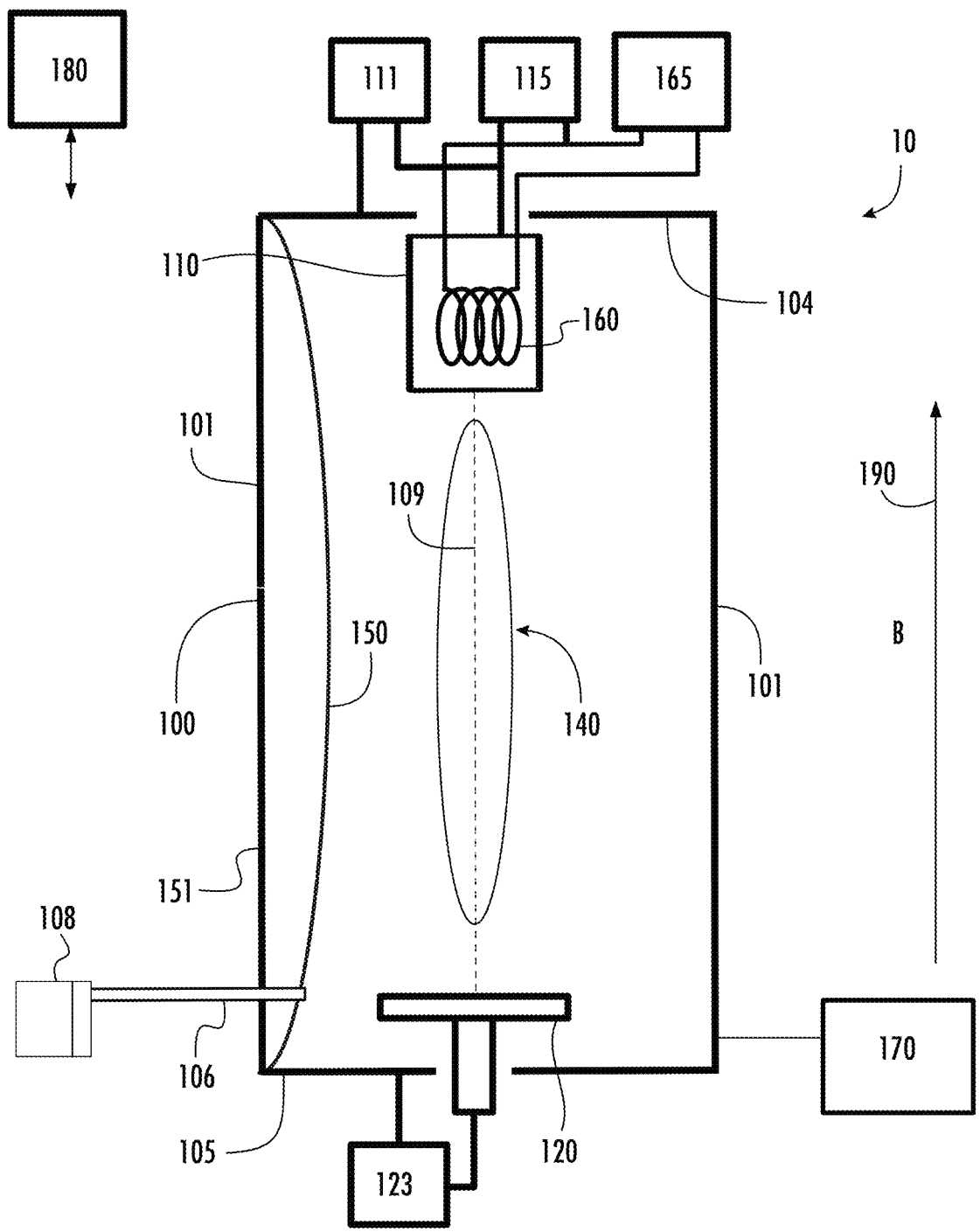
Figure 2A:
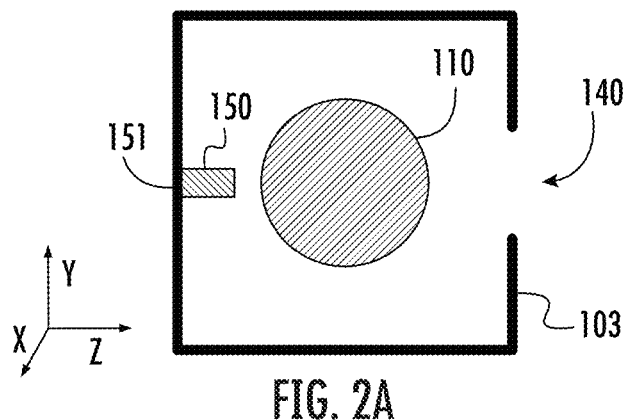
FIGS. 2A-2B are cross sectional views of the IHC ion sources of FIGS. 1A-1B, respectively.
Figure 2B:
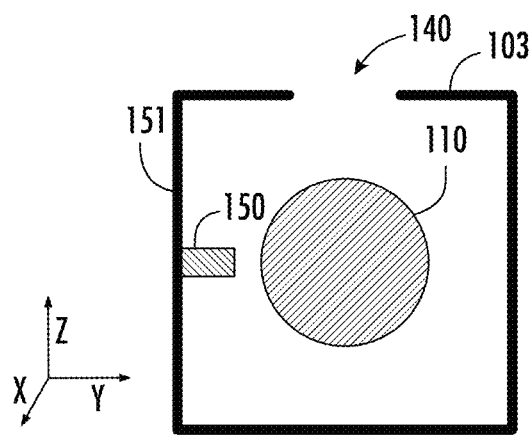

FIGS. 1A-1B show an IHC ion source 10 that may be utilized to extract a ribbon ion beam with improved uniformity according to two embodiments. FIGS. 2A-2B show the cross-sectional views of the IHC ion source 10 of FIGS. 1A-1B, respectively. In these embodiments, the IHC ion source 10 includes a chamber 100, comprising two opposite ends, and walls 101 connecting to these ends. These walls 101 include side walls, an extraction plate 103 and a bottom wall opposite the extraction plate 103. The extraction plate 103 includes an extraction aperture 140 through which ions are extracted. The extraction aperture 140 may be much larger in the width direction, also referred to as the X direction, than in the height direction, also referred to as the Y direction. The Z direction is defined along the thickness of the extraction plate 103 and is defined as the direction of travel for the ribbon ion beam. For example, the extraction aperture 140 may be greater than 2 inches in the width direction and less than 0.5 in the height direction.

The walls 101 of the chamber 100 may be constructed of an electrically conductive material, such as tungsten or another refractory metal, and may be in electrical communication with one another. A cathode 110 is disposed in the chamber 100 at a first end 104 of the chamber 100. A filament 160 is disposed behind the cathode 110. The filament 160 is in communication with a filament power supply 165. The filament power supply 165 is configured to pass a current through the filament 160, such that the filament 160 emits thermionic electrons. Cathode bias power supply 115 biases filament 160 negatively relative to the cathode 110, so these thermionic electrons are accelerated from the filament 160 toward the cathode 110 and heat the cathode 110 when they strike the back surface of cathode 110. The cathode bias power supply 115 may bias the filament 160 so that it has a voltage that is between, for example, 200V to 1500V more negative than the voltage of the cathode 110. The cathode 110 then emits thermionic electrons from its front surface into chamber 100.

Thus, the filament power supply 165 supplies a current to the filament 160. The cathode bias power supply 115 biases the filament 160 so that it is more negative than the cathode 110, so that electrons are attracted toward the cathode 110 from the filament 160. The cathode 110 is in communication with an arc voltage power supply 111. The arc voltage power supply 111 supplies a voltage to the cathode relative to the chamber 100. This arc voltage accelerates the thermionic electrons emitted at the cathode into chamber 100 to ionize the neutral gas. The current drawn by this arc voltage power supply 111 is a measurement of the amount of current being driven through the plasma. In certain embodiments, the walls 101 provide the ground reference for the other power supplies.

In this embodiment, a repeller 120 is disposed in the chamber 100 on the second end 105 of the chamber 100 opposite the cathode 110. The center of the cathode 110 and the center of the repeller 120 may form two points on the central axis 109 of the chamber 100.

The repeller 120 may be in electrical communication with a repeller power supply 123. As the name suggests, the repeller 120 serves to repel the electrons emitted from the cathode 110 back toward the center of the chamber 100. For example, in certain embodiments, the repeller 120 may be biased at a negative voltage relative to the chamber 100 to repel the electrons. For example, in certain embodiments, the repeller 120 is biased at between 0 and −150V relative to the chamber 100. In certain embodiments, the repeller 120 may be floated relative to the chamber 100. In other words, when floated, the repeller 120 is not electrically connected to the repeller power supply 123 or to the chamber 100. In this embodiment, the voltage of the repeller 120 tends to drift to a voltage close to that of the cathode 110. Alternatively, the repeller 120 may be electrically connected to the walls 101.

In certain embodiments, a magnetic field 190 is generated in the chamber 100. This magnetic field is intended to confine the electrons along one direction. The magnetic field 190 typically runs parallel to the walls 101 from the first end 104 to the second end 105. For example, electrons may be confined in a column that is parallel to the direction from the cathode 110 to the repeller 120 (i.e., the x direction). Thus, electrons do not experience electromagnetic force to move in the x direction. However, movement of the electrons in other directions may experience an electromagnetic force.

One or more gas containers 108 may be in communication with the chamber 100 via a gas inlet 106. Each gas container 108 may include a mass flow controller (MFC) so as to regulate a flow of gas from each gas container.

An extraction power supply 170 may be used to bias the walls 101 of the IHC ion source 10 relative to the rest of the components in the beam line. For example, the platen 260 (see FIG. 2) may be at a first voltage, such as ground, while a positive voltage is applied to the IHC ion source 10 such that the IHC ion source 10 is more positively biased than the platen 260. Thus, the voltage supplied by the extraction power supply 170, referred to as the extraction voltage, determines the energy of the ions that are extracted from the IHC ion source 10. Further, the current supplied by the extraction power supply 170 is a measure of the total extracted beam current.

In certain embodiments, there is a feedback loop between the cathode bias power supply 115 and the extraction power supply 170. Specifically, it may be desirable to maintain the extracted beam current at a constant value. Thus, the current supplied from the extraction power supply 170 may be monitored and the output of the cathode bias power supply 115 may be adjusted to maintain a constant extraction current. This feedback loop may be performed by the controller 180, or may be performed in another manner.

A controller 180 may be in communication with one or more of the power supplies such that the voltage or current supplied by these power supplies may be monitored and/or modified. Additionally, the controller 180 may be in communication with the MFCs of each gas container 108 so as to regulate a flow of each gas into the chamber 100. The controller 180 may include a processing unit, such as a microcontroller, a personal computer, a special purpose controller, or another suitable processing unit. The controller 180 may also include a non-transitory storage element, such as a semiconductor memory, a magnetic memory, or another suitable memory. This non-transitory storage element may contain instructions and other data that allows the controller 180 to perform the functions described herein. For example, the controller 180 may be in communication with the cathode bias power supply 115 to allow the IHC ion source 10 to vary the voltage applied to the cathode relative to the filament 160. The controller 180 may also be in communication with the repeller power supply 123 to bias the repeller. Further, the controller 180 may be able to monitor the voltage, current and/or power supplied by the cathode bias power supply 115.

Figure 3:
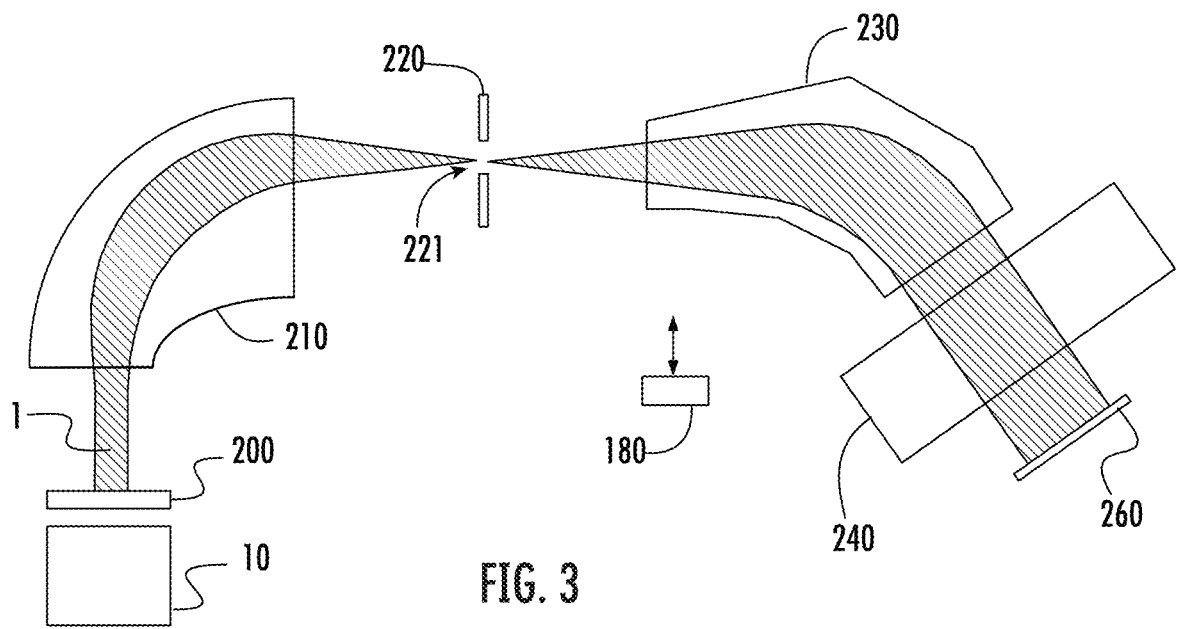
FIG. 3 is a block of an ion implantation system that uses the IHC ion source of FIG. 1.

FIG. 3 shows an ion implantation system using the IHC ion source 10 of FIG. 1A. Disposed outside and proximate the extraction aperture of the IHC ion source 10 are one or more electrodes 200.

Located downstream from the electrodes 200 is a mass analyzer 210. The mass analyzer 210 uses magnetic fields to guide the path of the extracted ribbon ion beam 1. The magnetic fields affect the flight path of ions according to their mass and charge. A mass resolving device 220 that has a resolving aperture 221 is disposed at the output, or distal end, of the mass analyzer 210. By proper selection of the magnetic fields, only those ions in the ribbon ion beam 1 that have a selected mass and charge will be directed through the resolving aperture 221. Other ions will strike the mass resolving device 220 or a wall of the mass analyzer 210 and will not travel any further in the system.

A collimator 230 may disposed downstream from the mass resolving device 220. The collimator 230 accepts the ions from the ribbon ion beam 1 that pass through the resolving aperture 221 and creates a ribbon ion beam formed of a plurality of parallel or nearly parallel beamlets. The output, or distal end, of the mass analyzer 210 and the input, or proximal end, of the collimator 230 may be a fixed distance apart. The mass resolving device 220 is disposed in the space between these two components.

Located downstream from the collimator 230 may be an acceleration/deceleration stage 240. The acceleration/deceleration stage 240 may be referred to as an energy purity module. The energy purity module is a beam-line lens component configured to independently control deflection, deceleration, and focus of the ion beam. For example, the energy purity module may be a vertical electrostatic energy filter (VEEF) or electrostatic filter (EF). Located downstream from the acceleration/deceleration stage 240 is a platen 260. The workpiece is disposed on the platen 260 during processing.

Returning to FIGS. 1A-1B and 2A-2B, the chamber 100 includes at least one wall 101 that has a protrusion 150, wherein the protrusion 150 extends inward from the interior surface that faces the chamber 100. This wall with the protrusion 150 may be referred to as the protruding wall 151. In other words, the protrusion 150 causes the thickness of the protruding wall 151 to vary. In certain embodiments, the protruding wall 151 is the bottom wall opposite the extraction plate 103, as shown in FIGS. 1A and 2A. In other embodiments, the protruding wall 151 is adjacent to the extraction plate 103, as shown in FIGS. 1B and 2B.

When the protruding wall 151 is as shown in FIGS. 1A and 2A, the protrusion 150 extends in the Z direction. When the protruding wall 151 is as shown in FIGS. 1B and 2B, the protrusion 150 extends in the Y or −Y direction.

In both embodiments, this protrusion 150 increases the loss area within the chamber 100. Specifically, the protrusion 150 is electrically conductive, electrically connected to the walls 101, and serves as a sink for free electrons and ions. This loss area serves to decrease the plasma density proximate the protrusion 150.

Figure 4A:
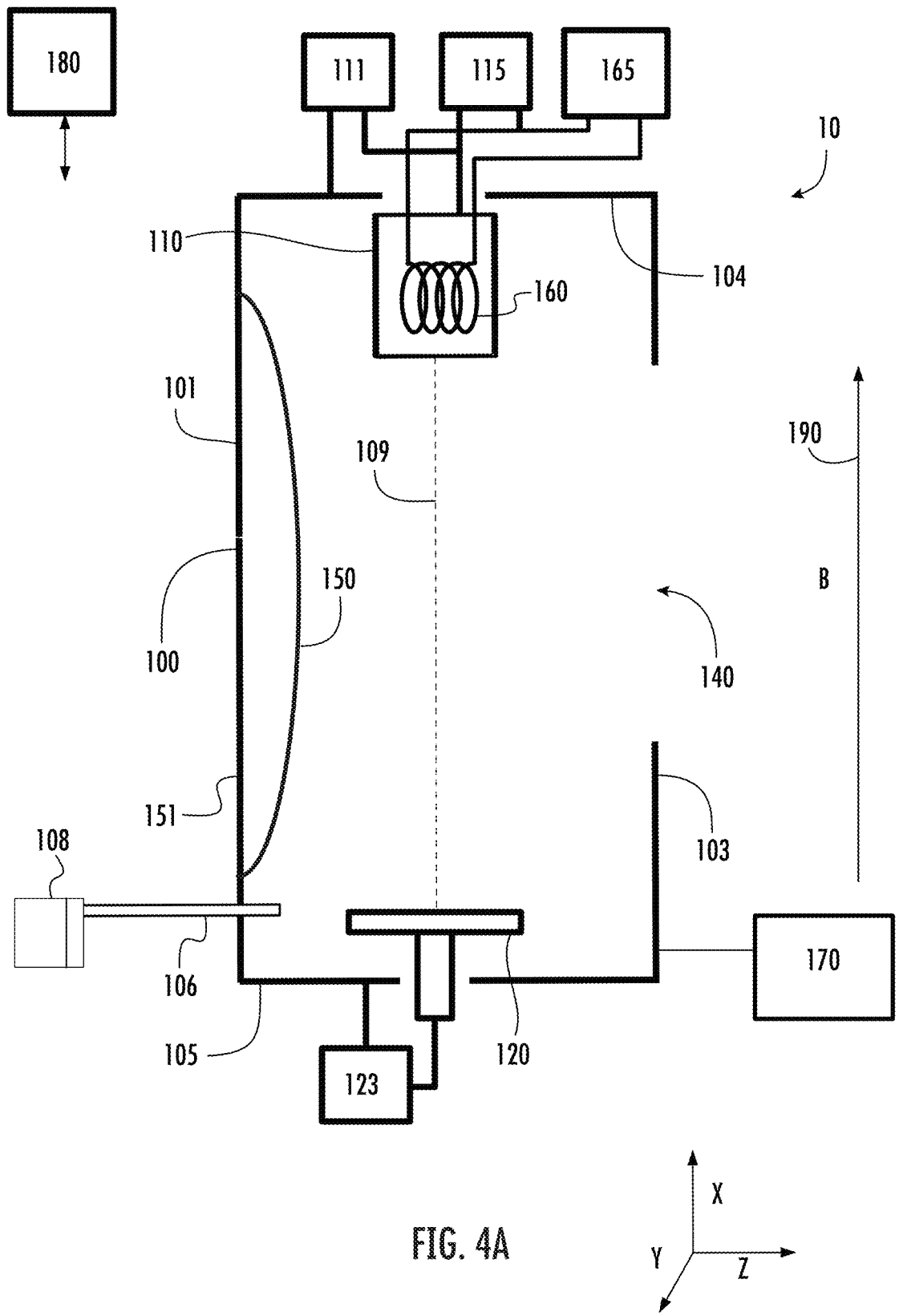
FIGS. 4A-4E are block diagrams of an IHC ion source according to other embodiments.
Figure 4B:
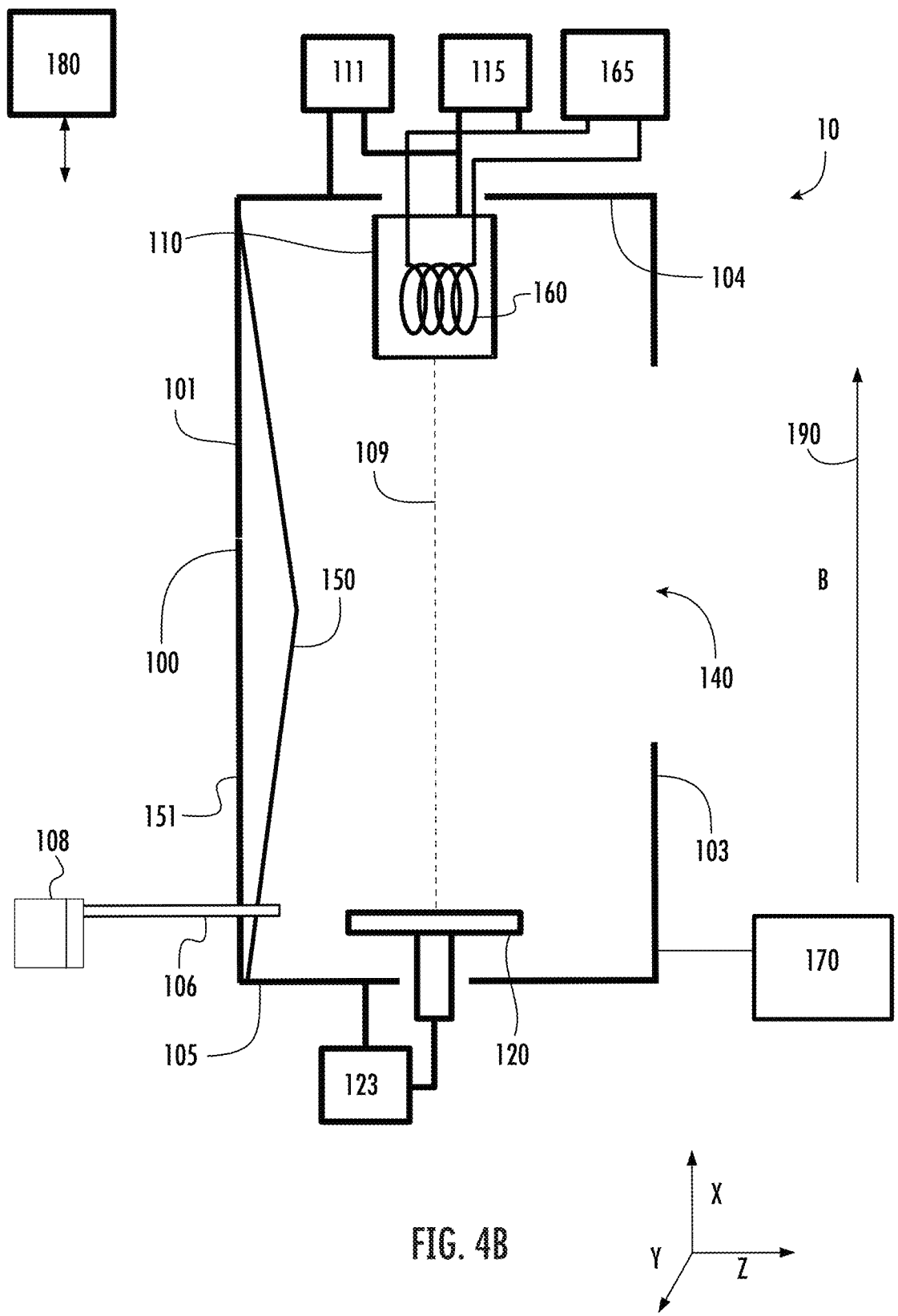

In some embodiments, the maximum extension of the protrusion 150 is at the center of the extraction aperture. The term "center of the extraction aperture" as used herein, refers to the center of the extraction aperture in the X or width direction. Further, while FIGS. 1A-1B show the maximum thickness of the protrusion 150 occurring at the center of the extraction aperture 140, other embodiments are also possible. For example, the maximum thickness of the protrusion may occur proximate the first end 104 and/or the second end 105, as shown in FIG. 4D. This may be beneficial if the ion source generates higher plasma densities near the ends.

The protrusion 150 may have any suitable shape. For example, in FIGS. 2A-2B, the cross section of the protrusion 150 is a rectangle that extends inward from the interior wall. The dimensions of the rectangle are defined as the thickness, which is the dimension toward the center of the chamber, and height, which is perpendicular to the thickness. The protrusion 150 may have a height of between 0.060 and 0.250 inches. This protrusion 150 may be referred to as a fin. Of course, other shapes are also possible. For example, the cross section of the protrusion 150 may be rounded and have a radius of curvature such that there are no edges in the chamber 100.

Additionally, the exterior surface of the protruding wall 151 that faces away from the chamber 100 may be unchanged and may remain planar. More specifically, the protrusion 150 extends into the chamber 100. Further, the thickness of the protrusion 150 may vary as a function of the position in the width direction (i.e., the X direction). For example, the thickness of the protrusion 150 may be thickest at the center of the extraction aperture 140, and decrease moving away from the center toward the first end 104 and the second end 105.

In certain embodiments, the maximum difference between the thinnest part of the protrusion 150 and the thickest part of the protrusion 150 may be between 5% and 25% of the height of the chamber 100. For example, the protrusion 150 may extend into the chamber 100 at least 1 mm at at least one location. In certain embodiments, the protrusion 150 may extend into the chamber 100 at least 3 mm at at least one location. Of course, other dimensions may be used in other embodiments.

In certain embodiments, the protrusion 150 may have a smooth radius of curvature along the X direction, similar to that shown in FIGS. 1A-1B. However, other curvatures are also possible. For example, there may be a first radius of curvature between the first end 104 and the center of the extraction aperture 140 and a second radius of curvature between the second end 105 and the center of the extraction aperture 140. Furthermore, while FIGS. 1A-1B show the protrusion 150 extending to the first end 104 and the second end 105, in other embodiments, the protrusion 150 may be smaller in the width direction, such that the protrusion 150 begins at a location away from the first end 104 and ends at a location before the second end 105, such as is shown in FIG. 4A.

FIGS. 1A-1B show the protruding wall 151 according to two embodiments. In these embodiments, the protrusion 150 begins at the first end 104 and extends to the second end 105. Further, the protrusion 150 has a constant radius of curvature throughout.

However, the protrusion 150 may have other shapes. For example, as shown in FIG. 4B, the protrusion 150 may appear as a triangular shape, where the thickness of the protrusion 150 increases linearly from the first end 104 to the center of the extraction aperture 140 and from the second end 105 to the center of the extraction aperture 140. In another embodiments, the protrusion 150 begins at a location after the first end 104 and ends at a location before the second end 105.

Figure 4C:
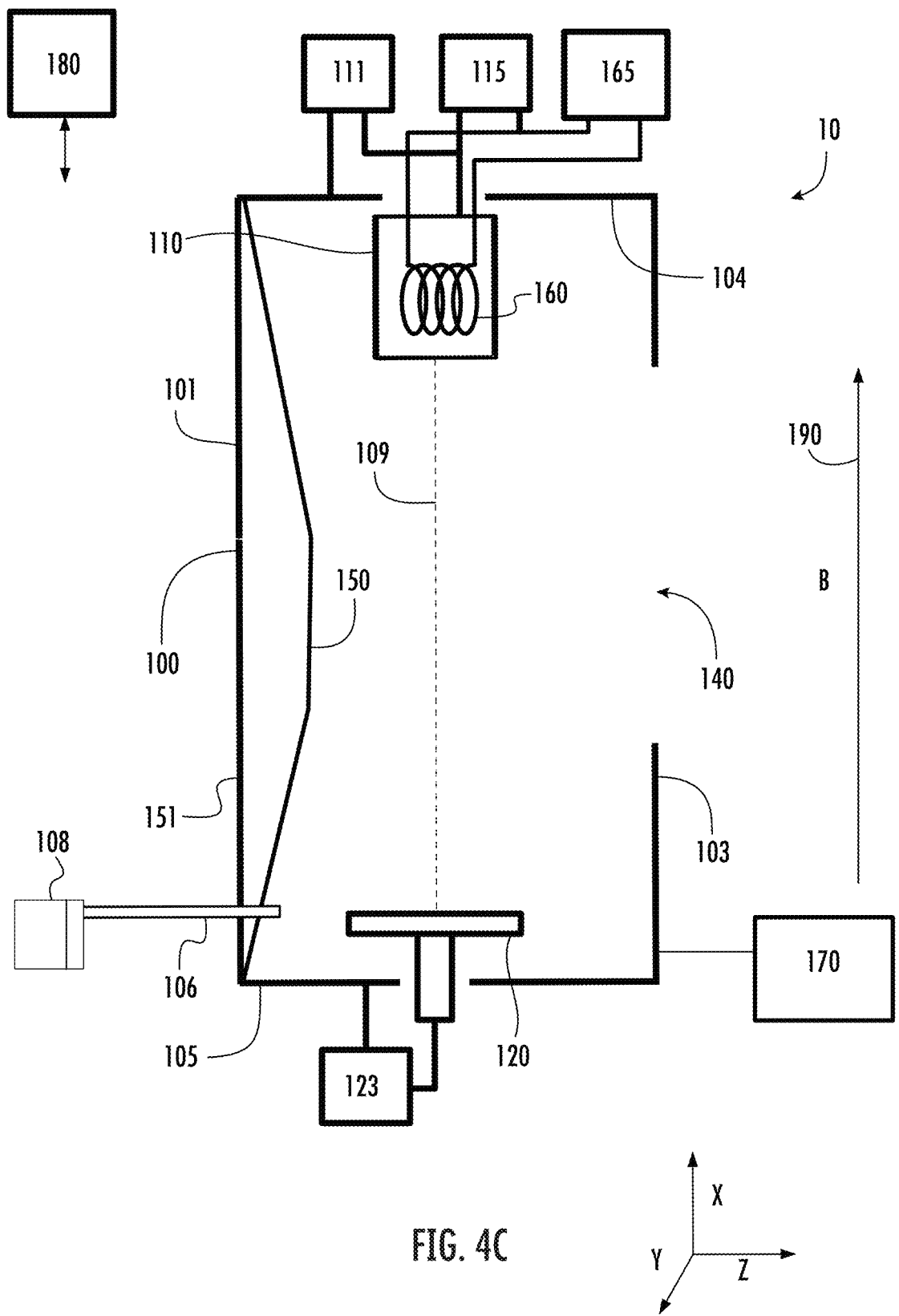
Figure 4D:
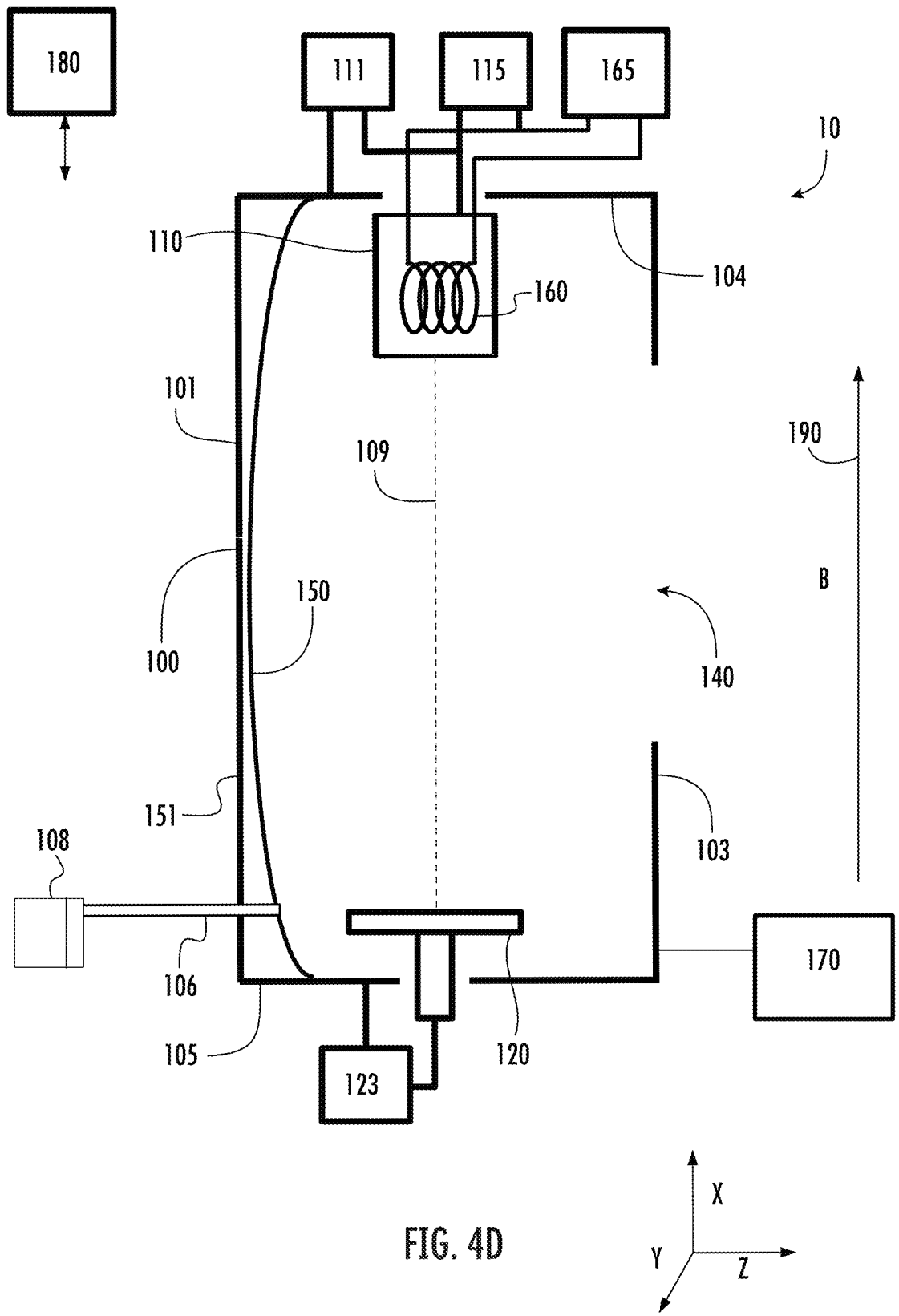

Alternatively, as shown in FIG. 4C, the protrusion 150 may be trapezoidal, where the thickness of the protrusion 150 increases linearly from the first end 104 and from the second end 105 to a flat region located near the center of the extraction aperture 140. In another embodiments, the protrusion 150 begins at a location after the first end 104 and ends at a location before the second end 105.

Figure 4E:
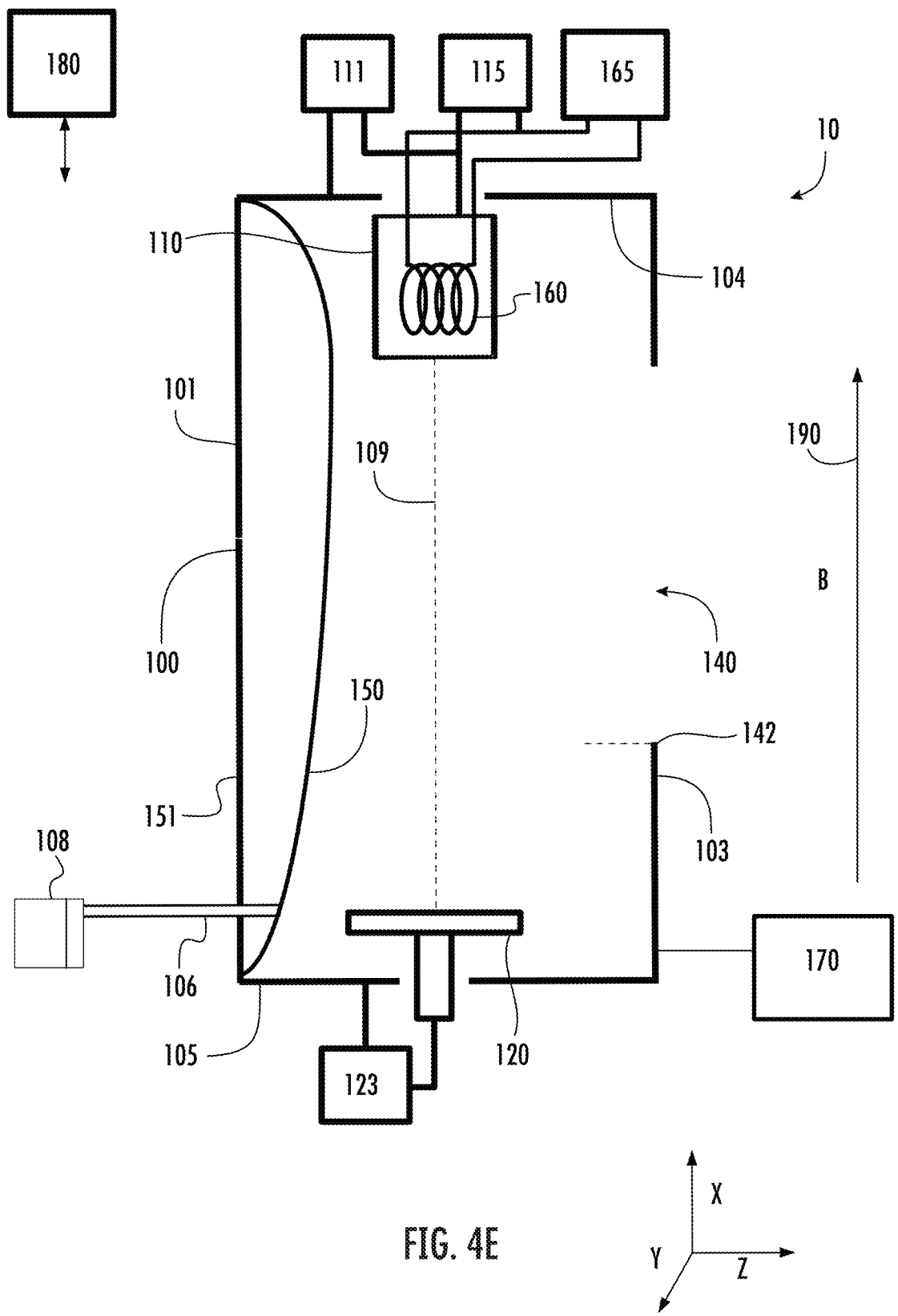

Additionally, all of the previous figures show the protrusion 150 being symmetrical about the center of the extraction aperture 140. However, other embodiments are also possible. For example, the plasma density within the ion source may be distributed such that the density near the first end 104 is greater than the density near the second end 105. In this case, the maximum (or minimum) thickness of the protrusion 150 may occur closer to the first end 104 than to the second end 105, as shown in FIG. 4E.

Further, while FIGS. 4A-4E show the protruding wall 151 as being opposite the extraction plate 103, in other embodiments, the protruding wall 151 may be adjacent to the extraction plate 103, such as is shown in FIG. 2A. In other words, the configurations of the protruding wall 151 shown in FIGS. 4A-4E can also be realized where the protruding wall 151 is adjacent to the extraction plate 103.

Additionally, in FIGS. 4A-4C, it is assumed that the maximum plasma density is found near the center of the extraction aperture 140. However, if the maximum plasma densities are disposed near the first end 104 and the second end 105, the shapes shown in FIGS. 4A-4C may be inverted, such that the minimum thickness is found at the center of the extraction aperture 140 and the maximum thickness is found near the ends, as shown in FIG. 4D.

Figure 5A:
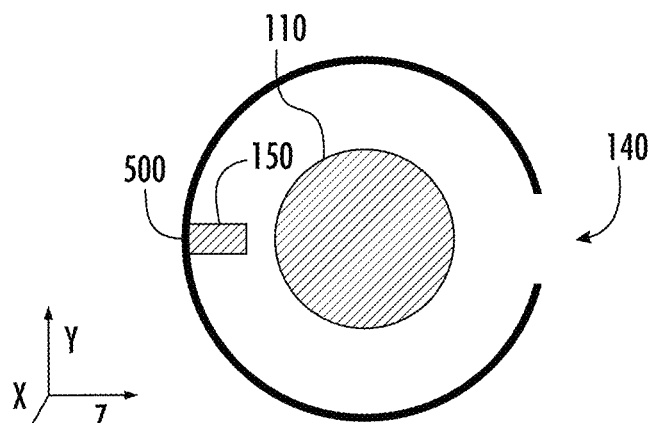
FIGS. 5A-5B are cross sectional views of a cylindrical IHC ion source according to two embodiments.
Figure 5B:
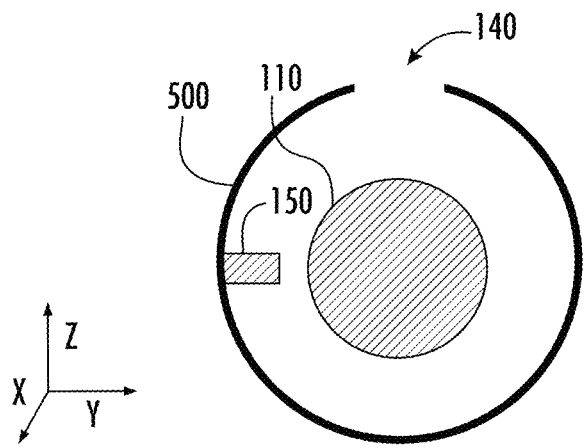

In another embodiment, shown in FIGS. 5A-5B, the chamber 500 may be cylindrical. The protrusion 150 may be disposed opposite the extraction aperture 140, or offset by 180°, as shown in FIG. 5A. In other embodiments, the protrusion may be disposed offset by 90° from the extraction aperture 140, as shown in FIG. 5B. Of course, the protrusion 150 may be disposed at any location along the interior surface of the chamber 500. Additionally, the shape of the protrusion 150 may be any of the shapes described above and shown in FIGS. 1A-1B and 4A-4E.

Without being bound to a particular theory, it is believed that the plasma within an IHC ion source 10 tends to rotate about the central axis 109. As shown in FIG. 1A, this central axis 109 passes through the center of the cathode 110 and the center of the repeller 120. This rotation may be caused by E×B drift. Note that a magnetic field 190 is created parallel to the central axis 109. Also, the electrical potential of the plasma is greatest at its center and decreases moving toward the walls 101. Therefore, there is an electrical field that that is perpendicular to the magnetic field 190. This combination creates an electromagnetic force in a direction that is perpendicular to both the magnetic field 190 and the electrical field. It is this electromagnetic force that may cause the rotation.

Figure 6:
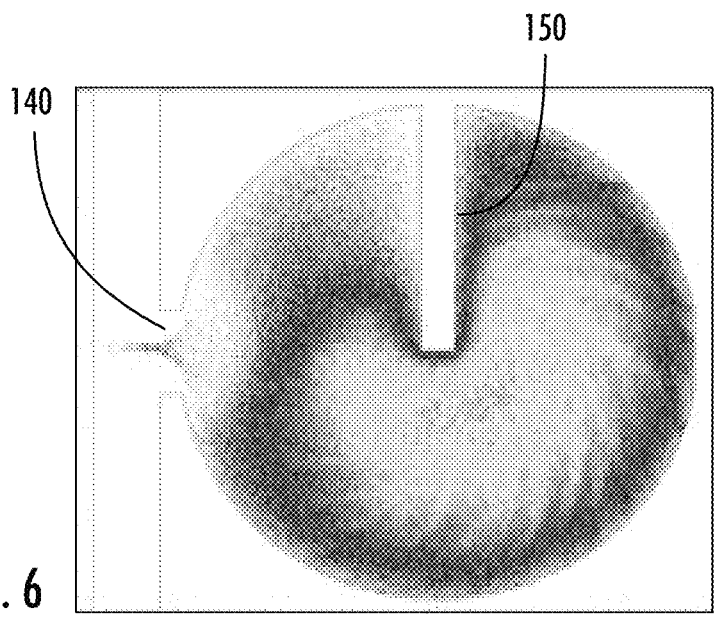
FIG. 6 is a diagram showing the effect of the protrusion on the plasma density.

By incorporating a protruding wall 151 in the chamber, the rotating plasma contacts the protrusion 150, which neutralizes free electrons and ions, which decreases the plasma density. This is shown in FIG. 6. Note that the plasma rotates in the counterclockwise direction in this figure. Also note that the plasma density is greatly reduced to the left of the protrusion 150. This phenomenon may be analogous to a wood lathe, which removes material in the locations where the turning tool is applied to the material being worked.

In other words, although it is believed that the plasma density may be greater near the center of the extraction aperture 140, by increasing the loss area in this region, the plasma density in this region may be reduced. Further, if the extraction current as a function of width is known, it may be possible to properly shape the protrusion 150 to reduce the plasma cross-sectional area appropriately across the width such that the extracted beam current is nearly constant along the width direction.

Figure 7:
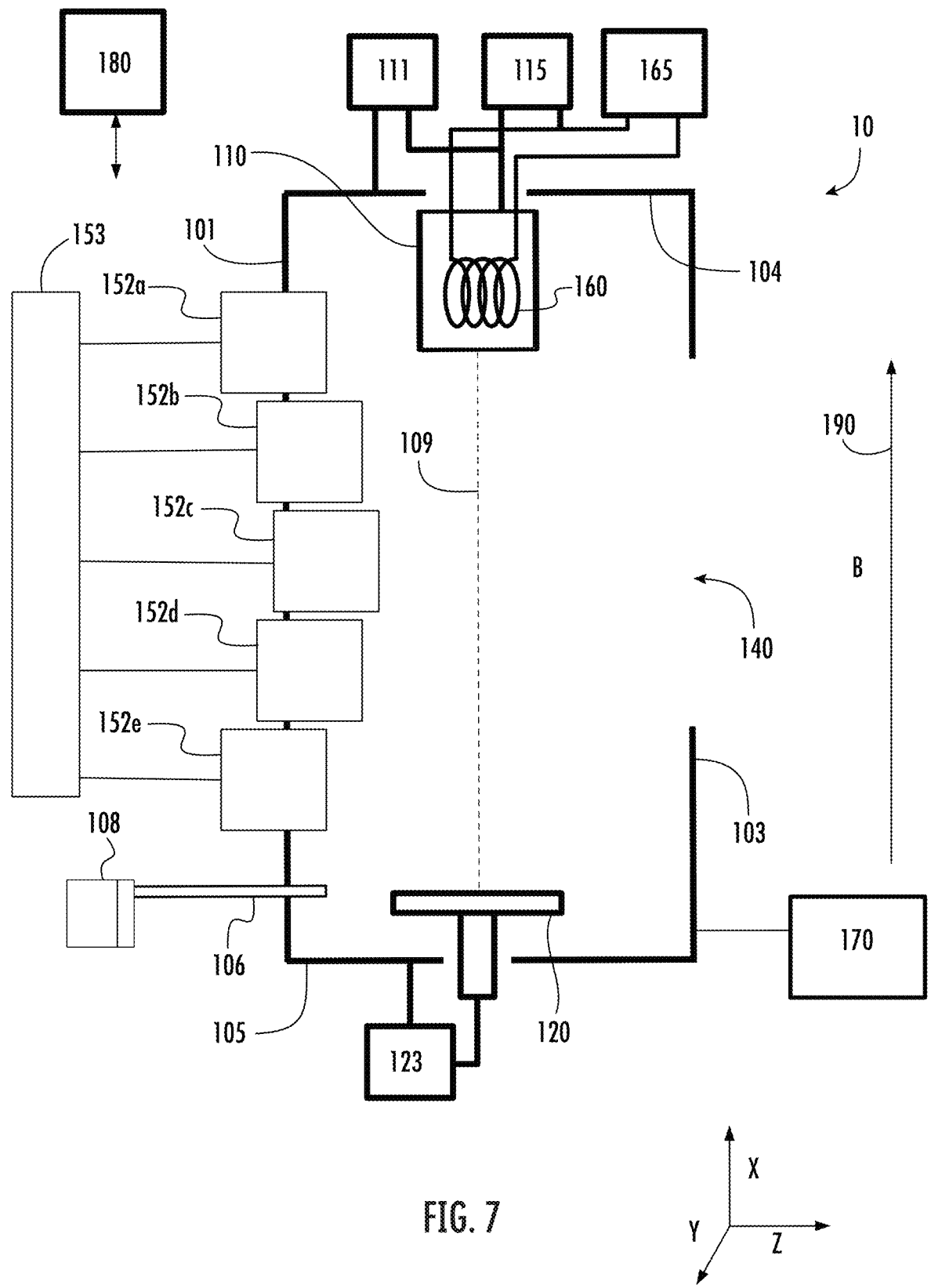
FIG. 7 is a block diagram of an IHC ion source having mechanically adjustable protrusion elements.

The ability to properly shape the protrusion 150 may be achieved using the embodiment shown in FIG. 7. In this embodiment, the protrusion is created through the use of a plurality of mechanically adjustable protrusion elements 152a-152e. While FIG. 7 shows five mechanically adjustable protrusion elements, the number of elements is not limited by this disclosure. In one embodiment, each of the mechanically adjustable protrusion elements 152a-152e may be independently controlled, allowing the protrusion to be a variety of different shapes. In other embodiments, groups of the mechanically adjustable protrusion elements 152a-152e may be commonly controlled. As an example, the mechanically adjustable protrusion elements 152a and 152e may be commonly controlled, and mechanically adjustable protrusion elements 152b and 152d may be commonly controlled. This configuration would create a protrusion that is symmetrical about the center of the extraction aperture 140.

The mechanically adjustable protrusion elements 152a-152e may be made of the same electrically conductive material as the walls, such as tungsten or another suitable material. The mechanically adjustable protrusion elements 152a-152e may be electrically connected to the walls 101 of the chamber 100. Further, the mechanically adjustable protrusion elements 152a-152e may be rectangular prisms, such that the top view of the protrusion elements is as shown in FIG. 7 and the side view is as shown in FIG. 2A or 2B. The dimensions of the rectangular protrusion elements may be defined as the thickness, which is the dimension toward the center of the chamber; the height, which is perpendicular to the thickness; and a width, which is the dimension in the X direction. These mechanically adjustable protrusion elements 152a-152e may have a height of between 0.060 and 0.250 inches. The mechanically adjustable protrusion elements 152a-152e may have a thickness of at least between 5% and 25% of the height of the chamber, so that they may extend into the chamber. The width of each mechanically adjustable protrusion element 152a-152e may be the same, or they may differ. For example, in certain embodiments, the mechanically adjustable protrusion elements 152a-152e extend across the entire width of the chamber, such that each of the N elements has a width of about W/N, where W is the width of the chamber 100. In other embodiments, the mechanically adjustable protrusion elements 152a-152e may also occupy the middle 50% of the width of the chamber 100. In this example, each of the N elements has a width of about W/2N, where W is the width of the chamber 100.

Of course, other shapes are also possible. For example, the cross section of the mechanically adjustable protrusion elements 152a-152e, as shown in FIG. 2A-2B, may be rounded and have a radius of curvature such that there are no edges in the chamber 100.

Further, while FIG. 7 shows the mechanically adjustable protrusion elements are having a flat surface that is exposed to the interior of the chamber, other embodiments are possible. For example, for the mechanically adjustable protrusion elements shown in FIG. 7, the interior surface may be rounded in the Y direction. These mechanically adjustable protrusion elements 152a-152e may be constructed of tungsten or another suitable material such as a refractory metal.

Further, while FIG. 7 shows the mechanically adjustable protrusion elements disposed on the wall opposite the extraction plate 103, other embodiments are possible. For example, the mechanically adjustable protrusion elements may be disposed on the wall adjacent the extraction plate 103, similar to the configuration shown in FIG. 1B.

Additionally, the mechanically adjustable protrusion elements may be used with a cylindrical chamber, such as those shown in FIGS. 5A-5B.

In certain embodiments, the mechanically adjustable protrusion elements 152a-152e may be coupled to one or more actuators 153. In other embodiments, the mechanically adjustable protrusion elements 152a-152e may be moved manually.

In some embodiments, there may be a calibration process to determine the proper position for each of the mechanically adjustable protrusion elements. For example, a beam profiler, such as an array of Faraday cups may be disposed outside the extraction aperture 140 along the beam line. For example, the array of Faraday cups may be disposed proximate the platen 260. The beam profiler may be in communication with the controller 180, which controls the actuator 153 so as to improve the uniformity of the extracted ion beam.

The above describes the ion source as being an IHC ion source. However, other ion sources may also be used with this extraction plate 103. For example, magnetized DC plasma sources, tubular cathode source, Bernas ion source and inductively coupled plasma (ICP) ion sources may also use this extraction plate 103 with the protrusion 150. Thus, the extraction plate may be used with an ion source having a variety of different plasma generators.

The present system and method have many advantages. As noted above, in certain ion sources that extract ribbon ion beams, the ribbon ion beam is not uniform across its width. Various techniques are employed to attempt to correct this non-uniformity. The present system provides a mechanism to selectively reduce the plasma density within certain regions in the chamber. In this way, even if the ion source generates a plasma that is denser in certain portions of the chamber, such as the center or near the cathode, the protrusion or mechanically adjustable protrusion elements may be able to compensate for this, allowing a more uniform ion beam to be extracted. Further, this system addresses the non-uniformity at the ion source, reducing the complexity and number of components that are traditionally used in the beam line system to compensate for this issue.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An ion source, comprising:
a chamber comprising a first end, a second end and a plurality of walls connecting the first end and the second end, wherein one of the plurality of walls is an extraction plate having an extraction aperture having a width greater than its height; and
a plasma generator to generate a plasma within the chamber;
wherein one of the plurality of walls, different from the extraction plate, is a protruding wall, having a protrusion extending toward an interior of the chamber, such that the protrusion causes a thickness of the protruding wall to vary as a function of position in a width direction.

2. The ion source of claim 1, wherein the protrusion extends at least 3 mm into the chamber at at least one location.

3. The ion source of claim 1, wherein the protrusion comprises a constant radius of curvature from the first end to the second end.

4. The ion source of claim 1, wherein the protrusion comprises a triangular shape.

5. The ion source of claim 1, wherein the protrusion comprises a trapezoidal shape.

6. The ion source of claim 1, wherein the protruding wall is opposite the extraction plate.

7. The ion source of claim 1, wherein the protruding wall is adjacent to the extraction plate.

8. The ion source of claim 1, wherein the plasma generator comprises an indirectly heated cathode disposed at the first end.

9. The ion source of claim 1, wherein a maximum thickness of the protrusion occurs at a center of the extraction aperture in the width direction.

10. An ion source, comprising:
a chamber comprising a first end, a second end, and a cylindrical housing connecting the first end and the second end, wherein an extraction aperture having a width greater than its height is disposed on the cylindrical housing; and
a plasma generator to generate a plasma within the chamber;
wherein a protrusion extends from the cylindrical housing toward an interior of the chamber, such that the protrusion causes a thickness of the cylindrical housing to vary as a function of position in a width direction.

11. The ion source of claim 10, wherein the protrusion is disposed on the cylindrical housing opposite the extraction aperture so as to be offset from the extraction aperture by 180°.

12. The ion source of claim 10, wherein the protrusion is offset from the extraction aperture by 90°.

13. The ion source of claim 10, wherein the plasma generator comprises an indirectly heated cathode disposed at the first end.

14. The ion source of claim 10, wherein a maximum thickness of the protrusion occurs at a center of the extraction aperture in the width direction.

* * * * *